(12) United States Patent
Takewaki et al.

(10) Patent No.: US 7,508,082 B2
(45) Date of Patent: *Mar. 24, 2009

(54) SEMICONDUCTOR DEVICE AND METHOD OF MANUFACTURING THE SAME

(75) Inventors: Toshiyuki Takewaki, Kawasaki (JP); Noriaki Oda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/844,381

(22) Filed: Aug. 24, 2007

(65) Prior Publication Data
US 2008/0017993 A1   Jan. 24, 2008

Related U.S. Application Data

(62) Division of application No. 10/953,454, filed on Sep. 30, 2004, now Pat. No. 7,327,031.

(30) Foreign Application Priority Data
Sep. 30, 2003   (JP)   ............... 2003-340983

(51) Int. Cl.
*H01L 23/48*   (2006.01)
*H01L 23/52*   (2006.01)
*H01L 29/40*   (2006.01)

(52) U.S. Cl. ............... 257/786; 257/750; 257/751; 257/767; 257/778; 257/779; 257/780; 257/781; 257/E23.019; 257/E23.02

(58) Field of Classification Search .............. None
See application file for complete search history.

(56) References Cited

U.S. PATENT DOCUMENTS

| 5,883,435 | A | 3/1999 | Geffken et al. | |
|---|---|---|---|---|
| 6,333,559 | B1 | 12/2001 | Costrini et al. | |
| 6,400,021 | B1 | 6/2002 | Cho | |
| 6,448,650 | B1 | 9/2002 | Saran et al. | |
| 6,656,828 | B1* | 12/2003 | Maitani et al. | 438/613 |
| 7,327,031 | B2* | 2/2008 | Takewaki et al. | 257/737 |
| 2001/0000928 | A1* | 5/2001 | Lee et al. | 257/786 |
| 2002/0111009 | A1 | 8/2002 | Huang et al. | |
| 2003/0102475 | A1* | 6/2003 | Kwon et al. | 257/48 |

FOREIGN PATENT DOCUMENTS

| JP | 10-229085 | 8/1998 |
|---|---|---|
| JP | 11-150114 | 6/1999 |
| JP | 2002-373893 | 12/2002 |
| JP | 2003-086589 | 3/2003 |

* cited by examiner

*Primary Examiner*—Minh-Loan T Tran
*Assistant Examiner*—Leslie Pilar Cruz
(74) *Attorney, Agent, or Firm*—Young & Thompson

(57) ABSTRACT

There is provided a solution to the problem of the poor adhesion in the pad portion while inhibiting the dishing in the pad portion. An SiON film, which covers insulating areas and has an opening above Cu pad areas, is formed, and a barrier metal film is formed in the opening of the SiON film. Such constitution provides the structure, in which the upper portion of the interfaces between the Cu pad areas and the insulating areas are covered by the SiON film.

6 Claims, 10 Drawing Sheets

PRIOR ART

PRIOR ART

PRIOR ART

SEMICONDUCTOR DEVICE AND METHOD OF MANUFACTURING THE SAME

This application is based on Japanese patent application No. 2003-340983, the content of which is incorporated hereinto by reference.

BACKGROUND OF THE INVENTION

1. Field of the Invention

The present invention relates to a semiconductor device comprising a bonding pad, and manufacturing method thereof.

2. Description of the Related Art

In recent years, the importance of the presence of a flip chip semiconductor device, which is utilized as a semiconductor device that is capable of achieving high-density assembly, is increasingly recognized. The flip chip semiconductor device comprises a flip-chip semiconductor chip and a multi-layer interconnect substrate having the chin mounted thereon. The flip-chip semiconductor chip comprises a bump having a protruded geometry, which contains metals having lower melting point such as solder, gold or the like, formed on the surface of the semiconductor chip. The multi-layer interconnect substrate comprises an electrode pad having a pattern that is same as the bump arrangement pattern.

When a bump is formed in such flip-chip semiconductor chip, a technology called Under Bump Metal (UBM), in which a polyimide film is provided on an electrode pad and an electrode is formed in the opening thereof, and then a solder ball is compressively bonded onto the electrode, is widely adopted for the purpose of preventing the generation of the crack in the solder during the heat cycles in the operation of the semiconductor device.

In order to prevent a dishing (a phenomena, in which a film thickness between a convex part and another convex part becomes thinner after conducting a polishing) occurred in a pad portion, technologies of providing an area consisting of an insulating material having an island shape or a slit shape is known. These technologies are disclosed in, for example, Japanese Patent Laid-Open No. H10-229,085 (1998) and Japanese Patent Laid-Open No. H11-150,114 (1999).

FIGS. 1A and 1B are schematic diagrams illustrating a conventional bump structure that utilizes the technology described above. FIG. 1A shows a plan view of a bump portion, and FIG. 1B is a cross sectional view thereof along a line AA' shown in FIG. 1A. A TiN film 104 is formed on an upper surface of a pad part 100 comprising a Cu pad area (a metal area) 101 and an insulating area 102, and a SiON film 106 and a polyimide film 108 are formed on the upper surface thereof in this sequence. An opening having a bottom surface of the TiN film 104 is provided on the SiON film 106 and the polyimide film 108. A multi-layered film 110 having TiW and Cu formed thereon in this sequence and a barrier metal film 120 comprising Ni film 112 and Cu film 114 are formed in the opening.

FIGS. 2A to 2D and FIGS. 3E and 3F are cross sectional views of the bump structure, illustrating the processes for forming the bump structure shown in FIG. 1. First, as shown in FIG. 2A, a pad portion 100 comprising a Cu pad area 101 and an insulating area 102 is formed as an uppermost layer of the multi-layer interconnect via a damascene process. The entire surface is not composed of the Cu pad area 101, and instead the insulating area 102 is provided therein to inhibit occurring of the dishing in the pad portion.

Then, radio frequency (RF) etching is conducted to etch a Cu oxide film formed on the surface of the Cu pad area 101 off, and thereafter the TiN film 104 is deposited via sputtering. A photo resist is applied over the TiN film 104 and exposed to light, and then the unwanted TiN film 104 is removed by dry etching process to form a pad and a fuse. This status is shown in FIG. 2B.

Subsequently, as shown in FIG. 2C, a SiON film 106 is formed on the TiN film 104, and thereafter a pad via 107 is opened as shown in FIG. 2D. The pad via 107 is formed so that almost entire area, on which the pad portion 100 is formed, is exposed.

Then, a polyimide film 108 is formed over the TiN film 104 and the SiON film 106 via an application process, and after that, exposure thereof is carried out to form an opening 109 on the pad portion 100 (FIG. 3E). Then, as shown in FIG. 3F, a cure process is conducted at a temperature of 400 degree C. for 10 minutes to form a cured polyimide film 108'. Thereafter, a multi-layered film 110 having TiW and Cu deposited in this sequence is formed in the opening by using a sputter process, and then the unwanted multi-layered film 110 is removed. A Ni film 112 and a Cu film 114 are formed on the multi-layered film 110 via a selective plating (FIG. 4). As described above, the bump structure comprising the barrier metal film 120 formed on the pad portion 100 via the TiN film 104 therebetween is completed. The related prior art documents are: Japanese Patent Laid-Open No. H10-229,085 (1998); and Japanese Patent Laid-Open No. H11-150,114 (1999).

However, according to the investigations of the present inventors, it was confirmed that the above-described process provides insufficient adhesion at an interface between the TiN film 104 and the barrier metal film 120, or generates flakes 132 as shown in FIG. 4. In other words, when the constitution of providing an area (insulating area 102) that consists of an insulating material in the pad is employed in order to prevent a dishing in the pad portion, such constitution may cause a new problem of generating a poor adhesion at the interface.

SUMMARY OF THE INVENTION

The present invention is made in view of the above-described circumstances, and there is provided a solution to the problem of the poor adhesion in the pad portion while inhibiting the dishing in the pad portion.

The inventors of the present invention have been actively investigated the possible cause for the decrease of the interface adhesion, in order to find a solution to the aforementioned problem. As a result, the inventors have found that precipitations of Cu (hereinafter referred to as "Cu foreign matter") are generated at the interfaces, and it is clarified that the generation of the precipitation causes the poor adhesion at the interface. The nature mentioned above will be described in reference to FIGS. 5A to 5C. The above-described process includes forming a bump-through hole by exposing the polyimide film 108 to light, and then the exposed polyimide film is further treated at an elevated temperature of 400 degree C. for 30 minutes to cure polyimide (FIG. 5A). In this occasion, Cu may be precipitated from the place where the coverage with the TiN film 104 is poor, in particular from the place where the interface between the Cu pad area 101 and the insulating area 102 is formed (FIG. 5B, FIG. 5C). When the barrier metal film 120 (Cu/TiW, Ni, Cu) of the solder bump is deposited on the precipitated Cu foreign matter, the precipitated Cu foreign matter exists between the barrier metal film 120 and the TiN film 104, thereby deteriorating the adhesiveness. FIG. 5C is an enlarged view thereof the place where the precipitated Cu foreign matter is generated shown in FIG. 5B. In this situation, when the solder ball is compressively bonded on the barrier metal film 120, flakes may be generated at the interface between the TiN film 104 and the barrier metal film 120.

The present invention is made on the basis of the new comprehension described above, and the solution thereof is to employ a configuration of inhibiting a generation of Cu foreign matter, thereby improving the adhesiveness in the pad portion.

According to the present invention, there is provided a semiconductor device comprising a bonding pad including a principal surface that is capable of providing an electrical coupling to an external interconnect, wherein the bonding pad comprises a pad portion containing a metal area and an insulating area, and an insulating film provided on the pad portion, the insulating film covering the insulating area and having an opening above at least a portion on the metal area.

According to the present invention, there is provided a method for manufacturing a semiconductor device, comprising: forming a first insulating film on a semiconductor substrate; selectively removing a portion of the first insulating film to form a concave portion; forming a metal film to fill the concave portion therewith; polishing the metal film to remove a portion of the metal film that is formed outside of the concave portion; forming a second insulating film over the first insulating film and the metal film; and selectively removing a portion of the second insulating film to form an opening above at least a portion of an upper part of the metal area.

According to the present invention, since the pad portion contains a metal area and an insulating area, the dishing can effectively be inhibited, and since the insulating film, which covers the insulating areas and has the opening above the metal areas 101, is formed, the generation of the Cu foreign matter mentioned above can effectively be inhibited.

Alternatively, the present invention may have another configuration, further comprising an electrically conducting film being electrically coupled to the metal area via the opening. Having such configuration, a better electrical coupling to the pad portion may be achieved while inhibiting the generation of the Cu foreign matter.

The conformation of the insulating area is not particularly limited in the present invention, and a conformation thereof having a plurality of insulating areas provided within the pad portion in an island-shaped manner may be employed. When a plurality of insulating areas are provided within the pad portion in the island-shaped manner, the generation of the dishing may be inhibited more effectively.

Alternatively, the present invention may have another configuration further comprising a diffusion barrier film between the insulating film and the pad portion, wherein the barrier metal film is provided so as to be in contact with the diffusion barrier film. Having such configuration, diffusion of the metal from the pad portion may be prevented.

According to the present invention, the problem of the poor adhesion in the pad portion can be solved while inhibiting the dishing in the pad portion.

DETAILED DESCRIPTION OF THE INVENTION

Embodiments according to the present invention will be illustrated in reference to the annexed figures. In all the annexed figures, identical numeral number is assigned for indicating the identical component, and related descriptions are omitted.

First Embodiment

An example of a flip-chip semiconductor device comprising a bonding pad will be illustrated in this embodiment.

Figure 1A:
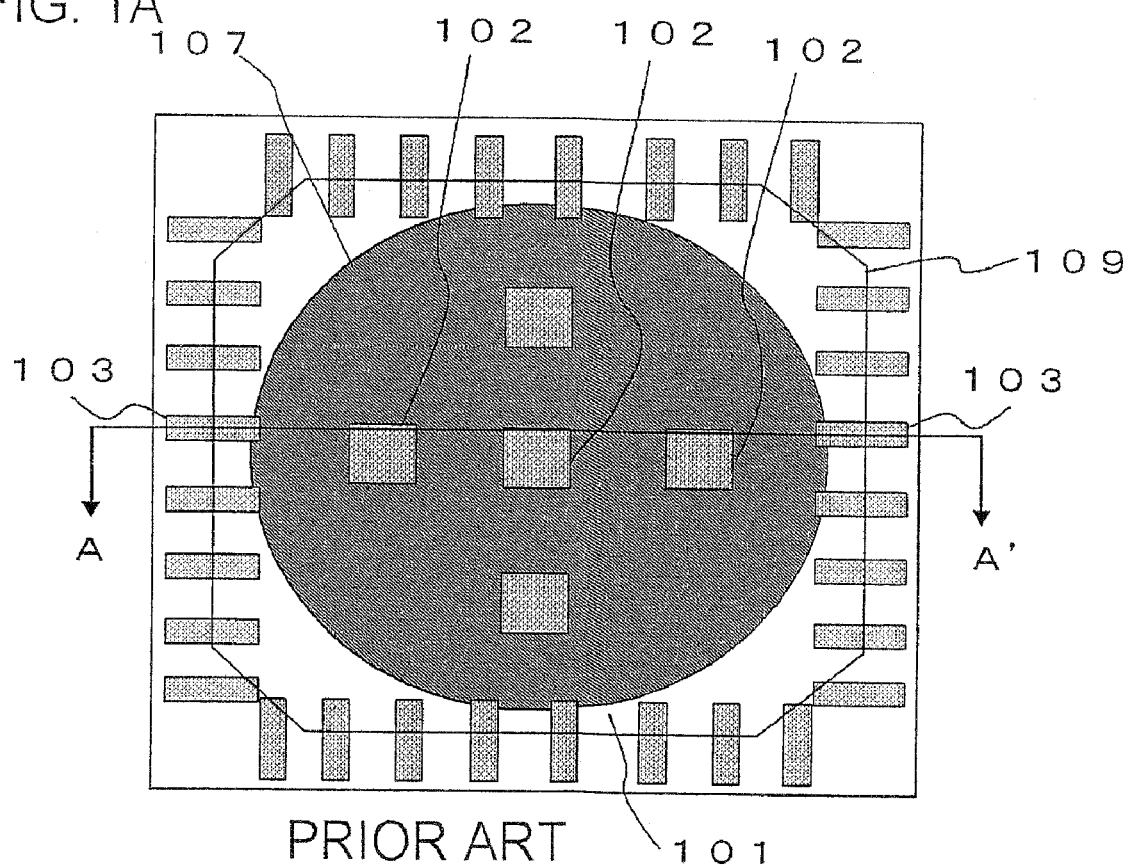
FIG. 1A is a plan view of a bump portion of the conventional semiconductor device.
Figure 1B:
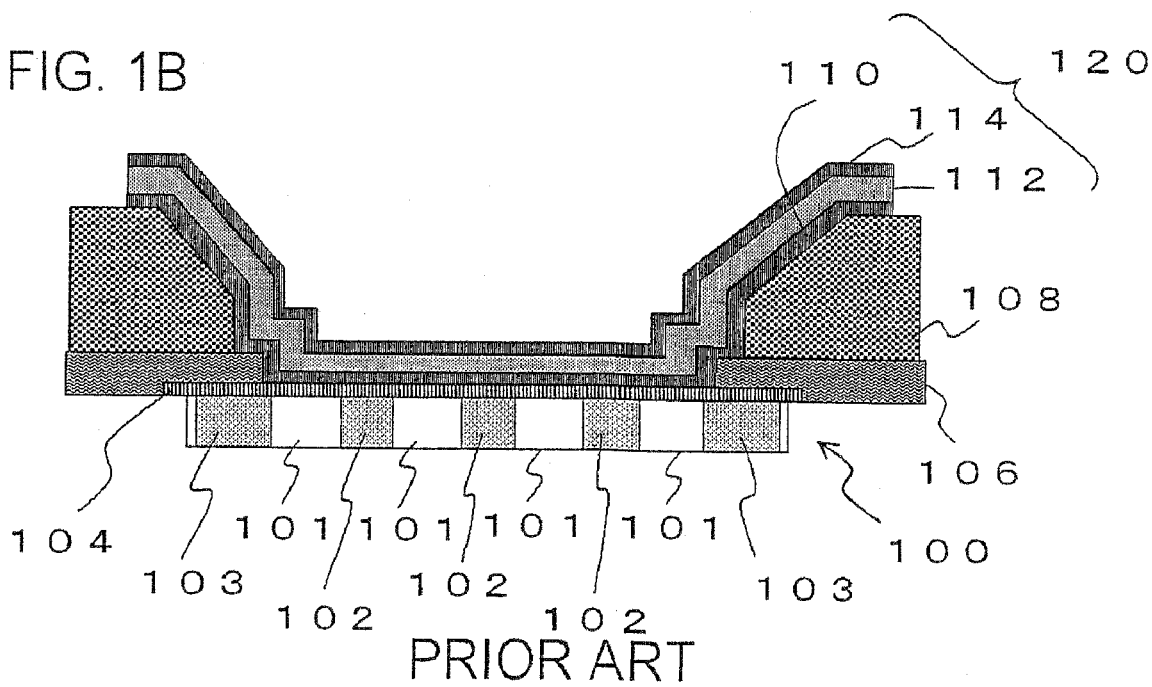
FIG. 1B is a cross sectional view along a line AA' shown in FIG. 1A.
Figure 2A:
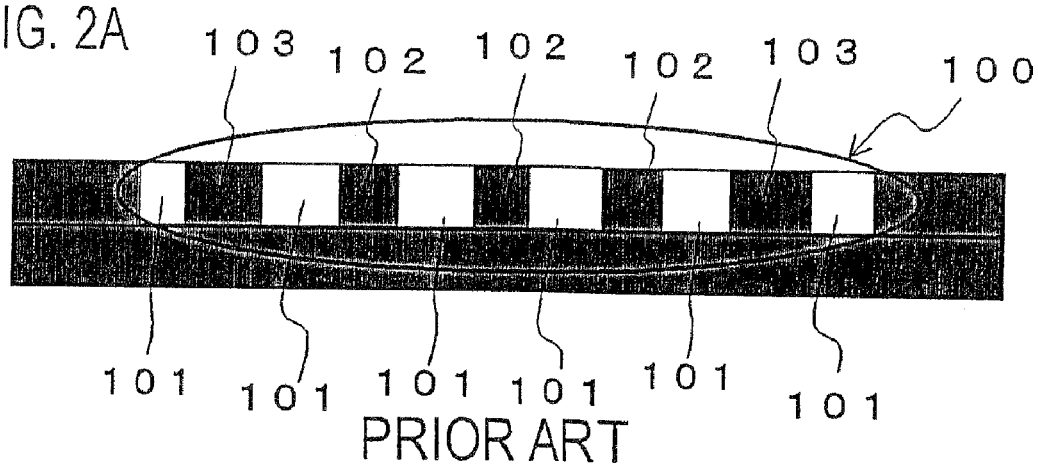
FIGS. 2A to 2D are cross sectional views of the bump structure, illustrating the conventional method for manufacturing the semiconductor device.
Figure 2B:
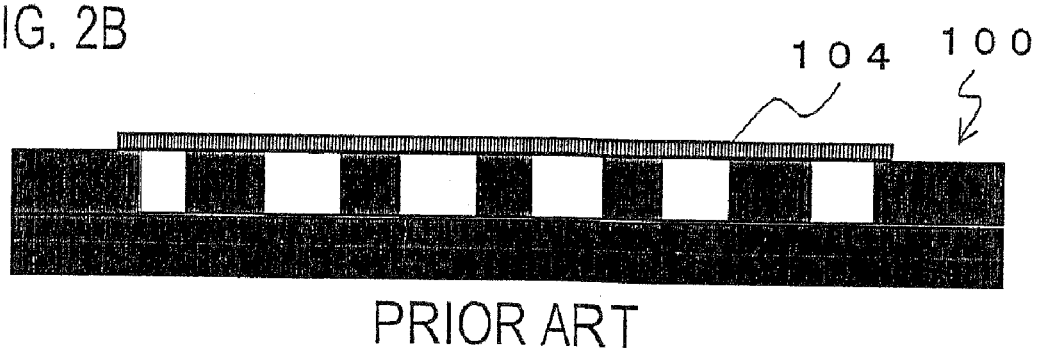
Figure 2C:
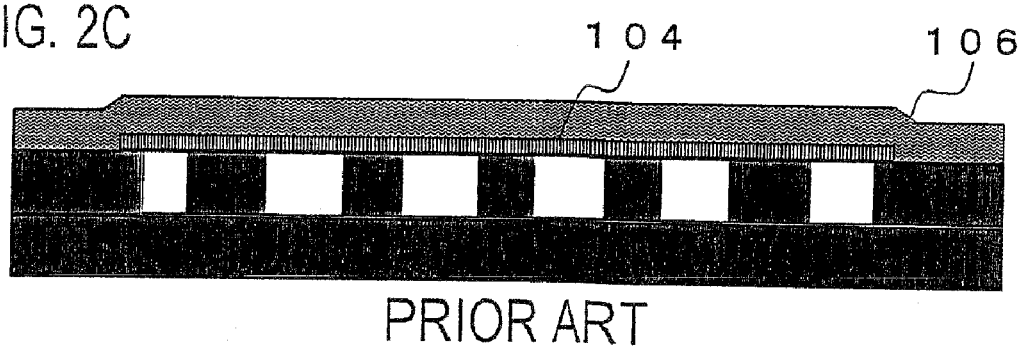
Figure 2D:
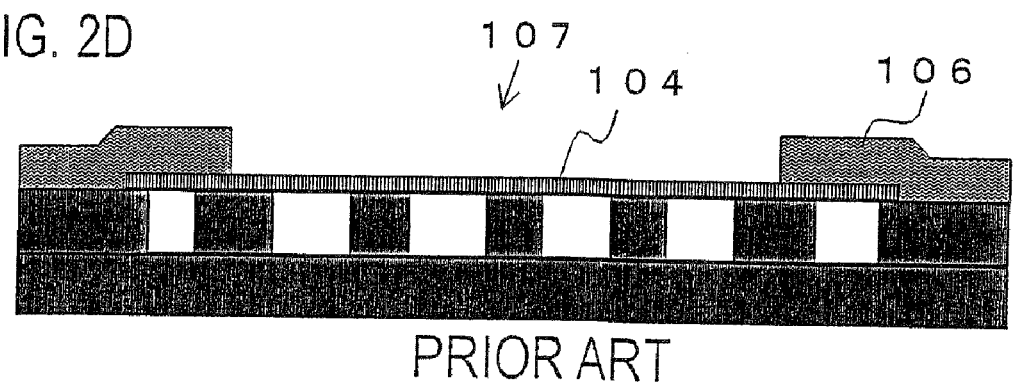
Figure 3E:
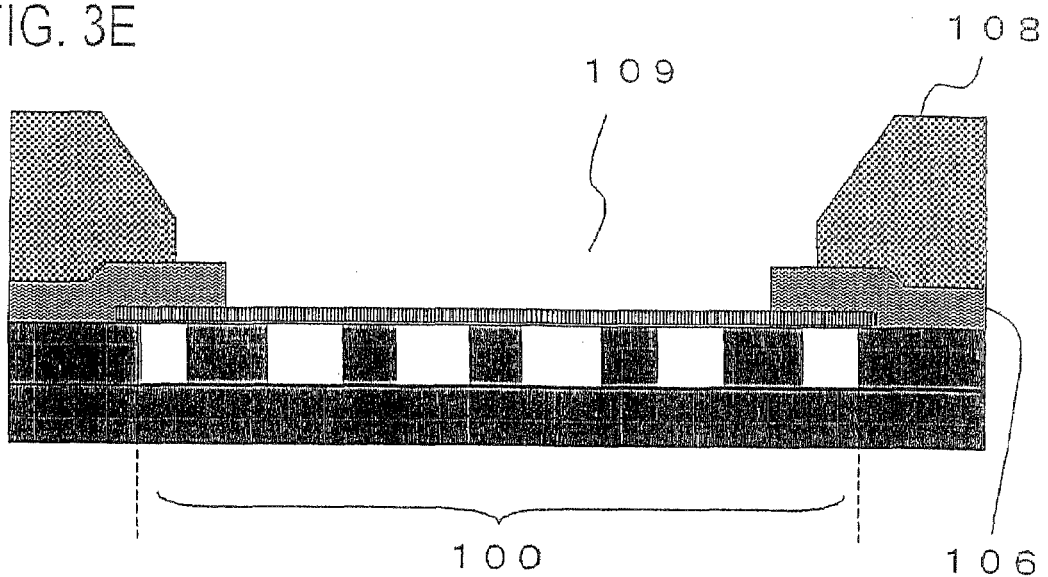
FIGS. 3E and 3F are cross sectional views of the bump structure, illustrating the conventional method for manufacturing the semiconductor device.
Figure 3F:
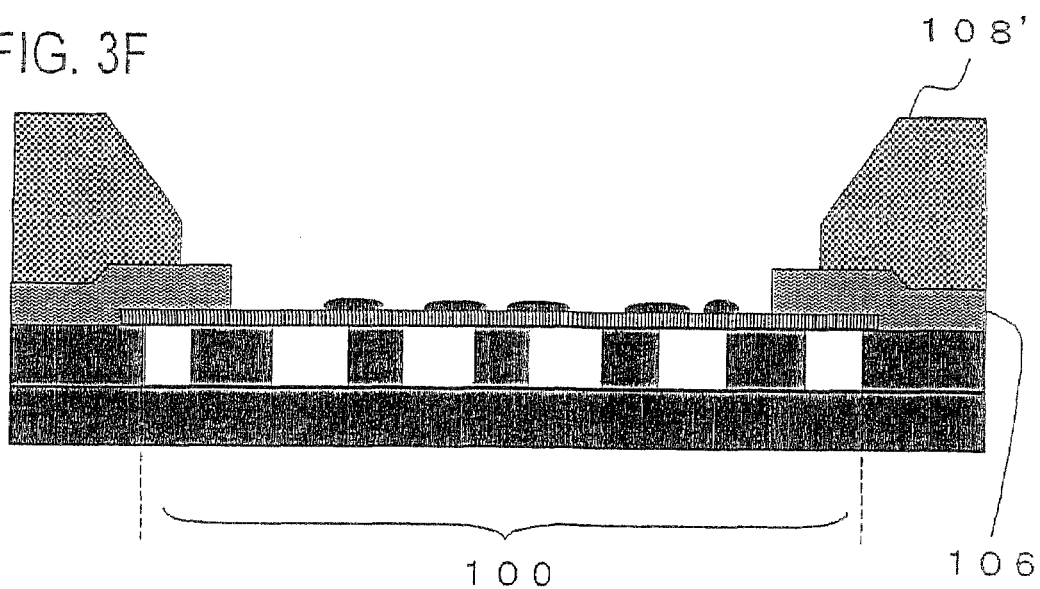
Figure 4:
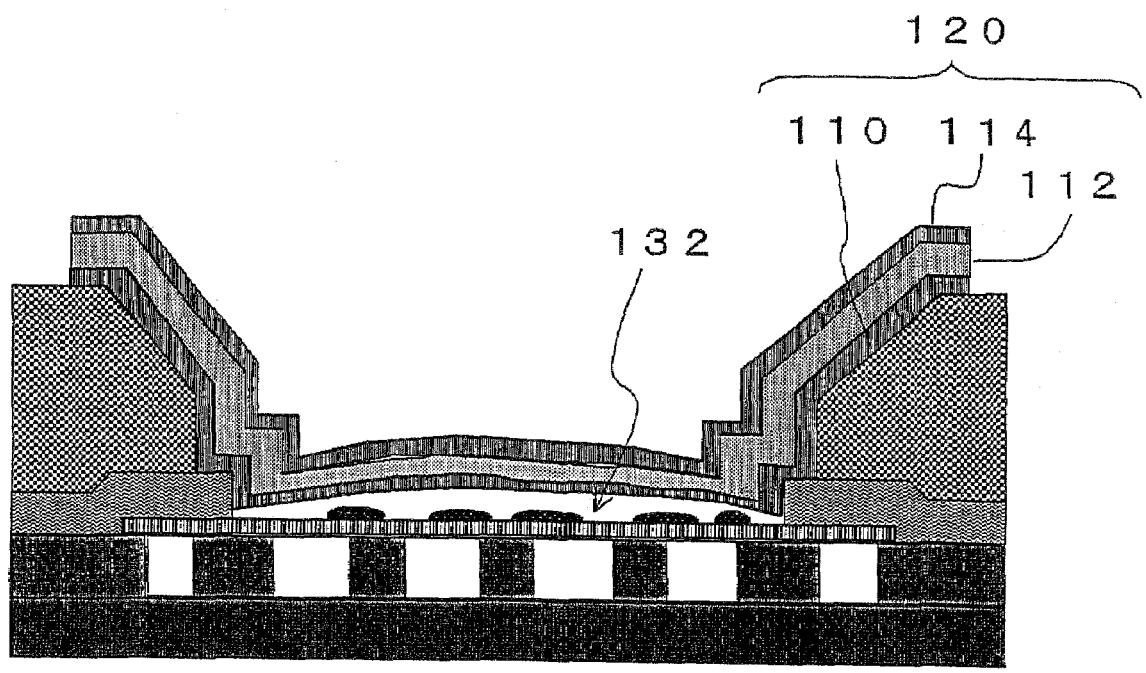
FIG. 4 is a cross sectional view of the bump structure, illustrating the conventional method for manufacturing the semiconductor device.
Figure 5A:
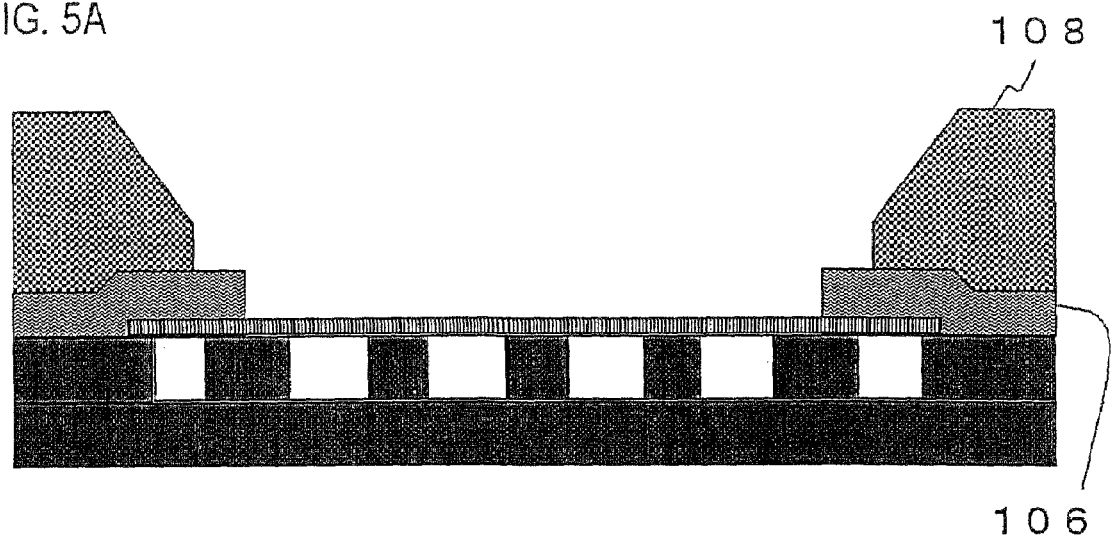
FIGS. 5A, 5B and 5C are cross sectional views of the bump structure, explaining causes of generation of Cu foreign matter in the conventional method for manufacturing the semiconductor device.
Figure 5B:
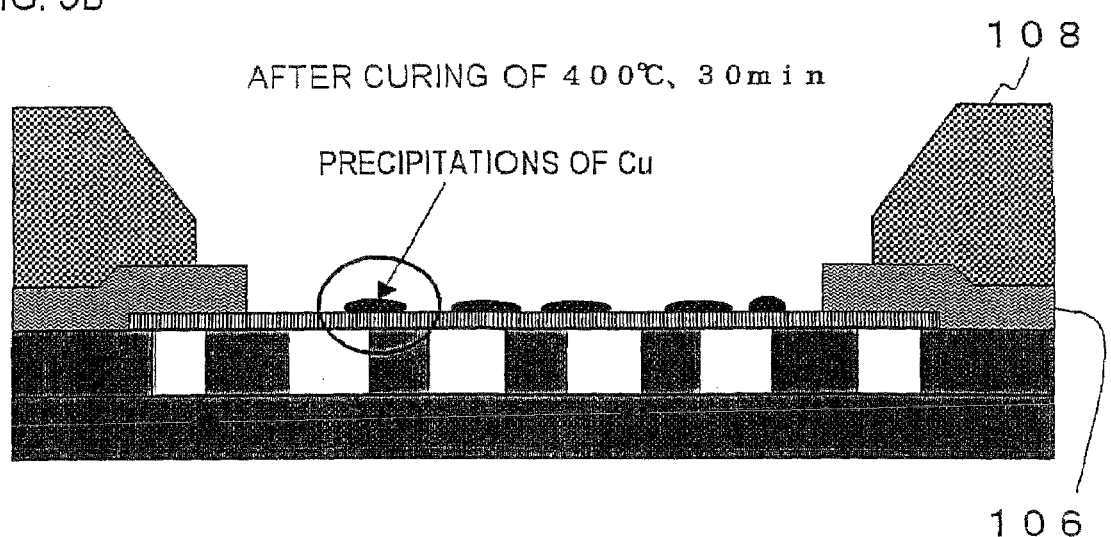
Figure 5C:
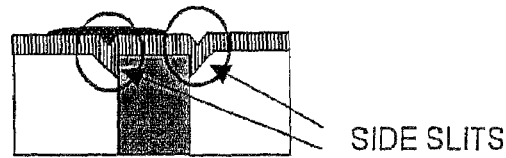
Figure 6A:
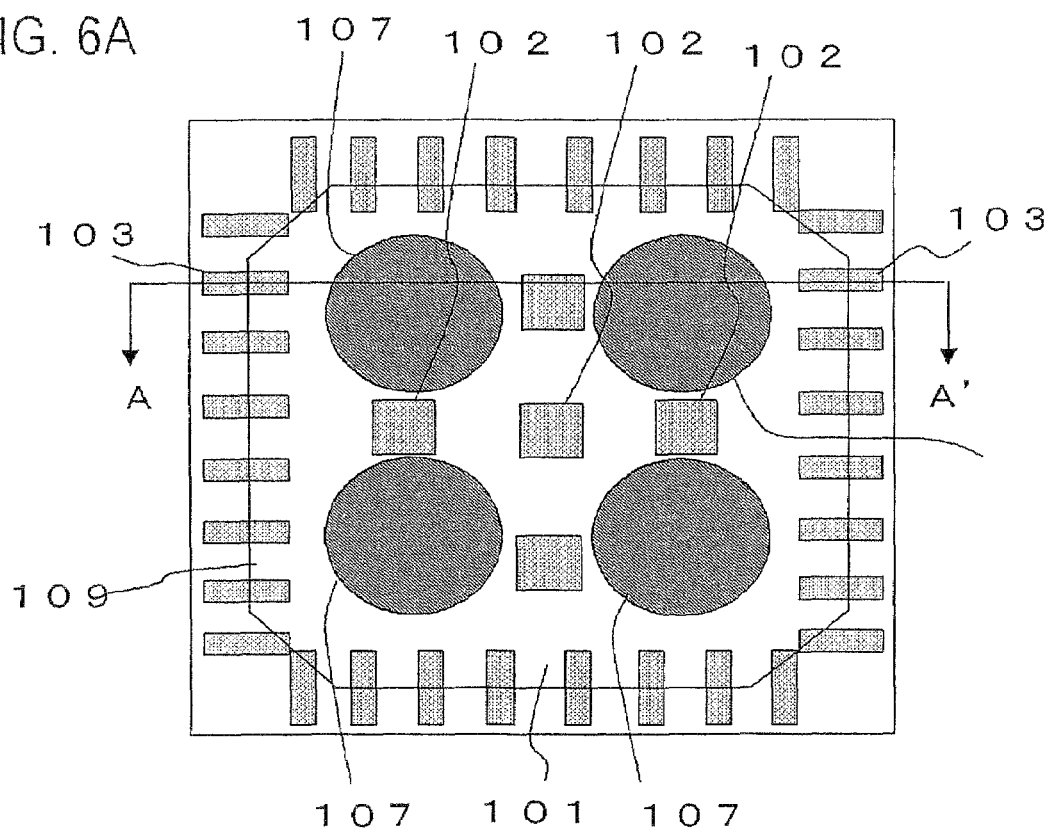
FIG. 6A is a plan view of a pad portion of an embodiment according to the present invention.
Figure 6B:
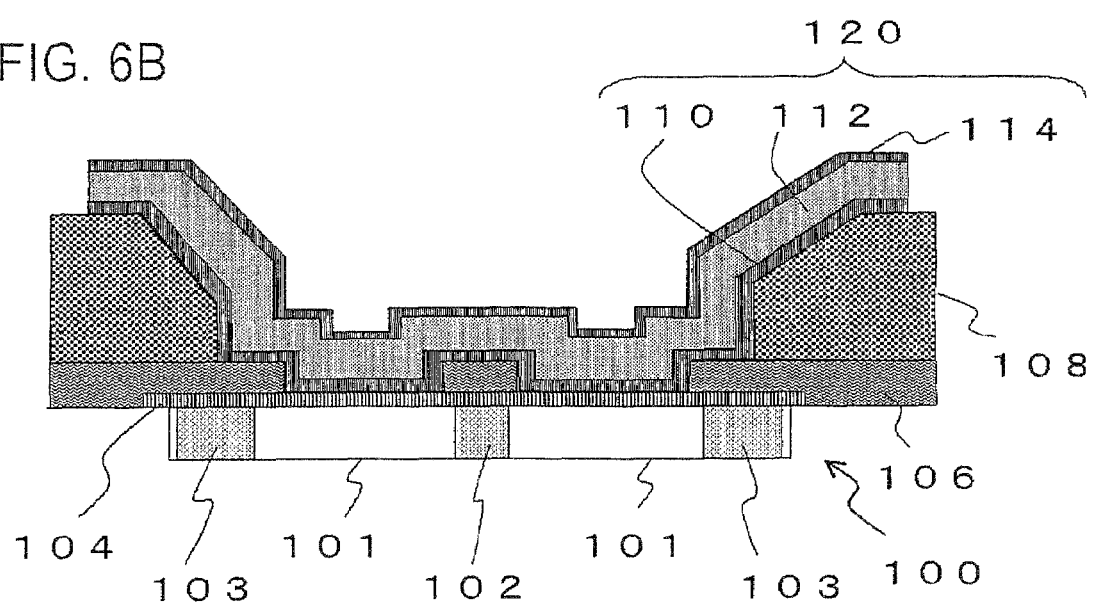
FIG. 6B is a cross sectional view along a line AA', shown in FIG. 6A.

FIGS. 6A and 6B are schematic diagrams showing a structure of a bonding pad according to this embodiment. FIG. 6A is a plan view of a bump portion, and FIG. 6B is a cross sectional view along a line AA' shown in FIG. 6A. TiN film 104, which functions as a diffusion barrier film, is formed on an upper surface of a pad part 100 that comprises a Cu pad area 101 and an insulating area 102, and a SiON film 106 and a polyimide film 108 are formed thereon in this sequence. An opening having a bottom surface of the TiN film 104 is provided over the SiON film 106 and the polyimide film 108. A multi-layered film 110 comprising TiW and Cu deposited in this sequence and a barrier metal film 120 comprising a Ni film 112 and a Cu film 114 are formed in the opening.

Figure 7A:
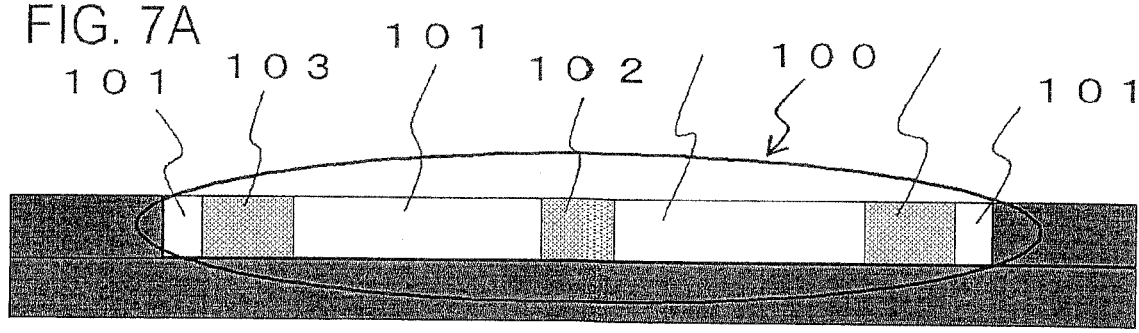
FIGS. 7A to 7D are cross sectional views of the bump structure, illustrating the method for manufacturing the semiconductor device described in the embodiment according to the present invention.

FIGS. 7A to 7D and FIGS. 8E and 8F are schematic diagrams showing a formation process for the bump structure shown in FIGS. 6A and 6B. First, as shown in FIG. 7A, a pad portion 100 comprising a Cu pad area (metal area) 101 and an insulating area 102 is formed as an uppermost layer of the multi-layer interconnect via a damascene process. More specifically, the uppermost portion of the insulating film of the interconnect structure formed on the silicon substrate is selectively removed to form concave portions, and a copper film is formed on entire surface of the substrate so as to fill the concave portions therewith. Then, chemical mechanical polishing (CMP) is conducted to remove the portions of the copper film that are formed outside of the concave portions. Having the above-described processes, the structure shown in FIG. 7A is obtained. As shown in the figures, the generation of the dishing in the pad portion can be reduced by providing the insulating area 102 on the entire pad area without forming the Cu pad area 101. In this embodiment, the size of the pad is set to 50 μm, and the dummy oxide films (insulating areas 103) having a width of 3 μm and a length of 10 μm are arranged at the perimeter thereof and the dummy oxide film (insulating area 102) of the square shape having sides of 5 μm is arranged in the central part thereof.

Figure 7B:
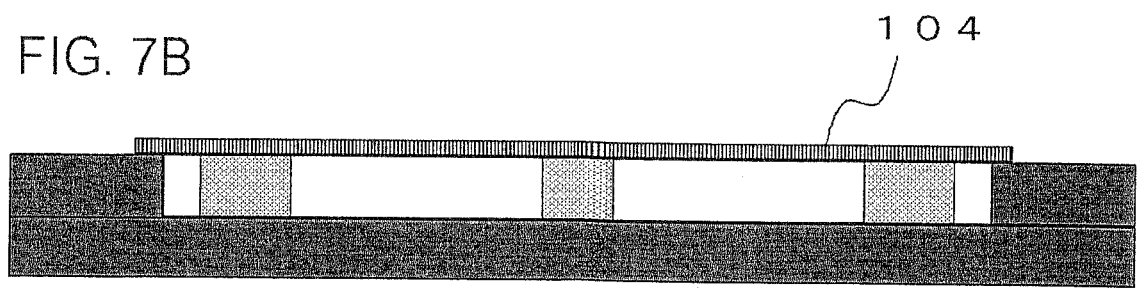

Then, the Cu oxide film on the surface of the Cu pad area 101 is removed via a radio frequency (RF) etching, and thereafter a TiN film 104 is deposited via a sputtering. Film thickness of the TiN film 104 is set to 200 nm, and the etching is conducted to remove 10 nm via the RF etching. A photo resist is applied on the TiN film 104 and exposed to light, and thereafter the unwanted TiN film 104 is removed by dry etch process to form a pad and a fuse. This status is shown in FIG. 7B.

Figure 7C:
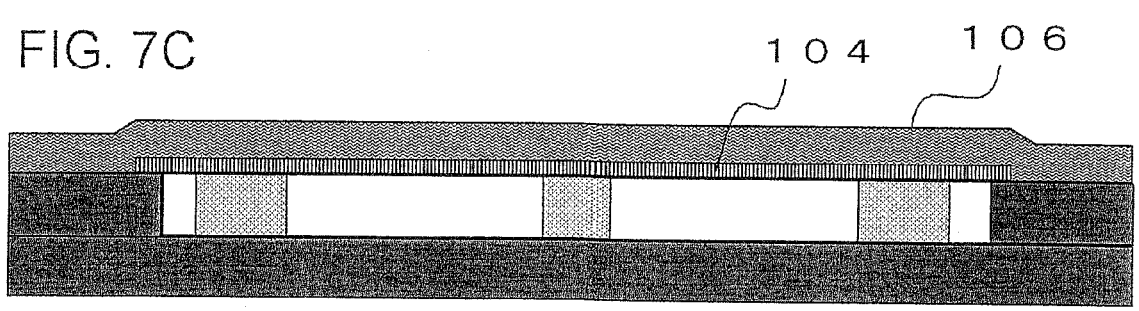
Figure 7D:
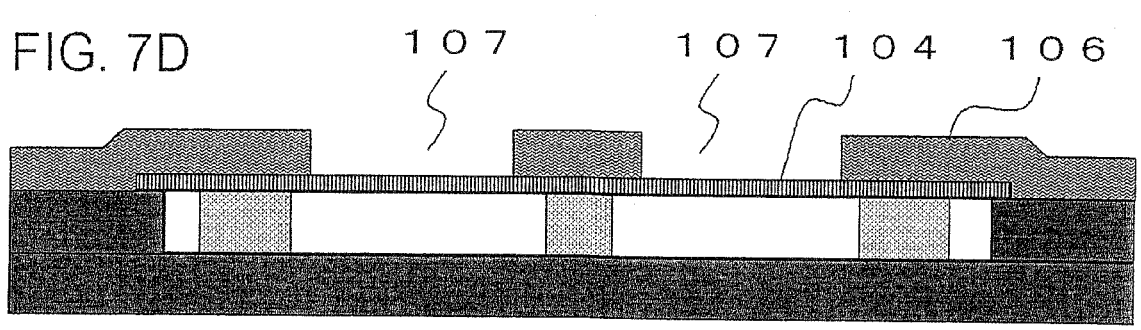

Subsequently, as shown in FIG. 7C, a SiON film 106 is formed on the TiN film 104. Film thickness of SiON film 106 is set to 350 nm. Thereafter, a pad via 107 is opened as shown in FIG. 7D. The pad via 107 is formed so that, among the pad portion 100, only the portion having Cu pad area 101 formed thereon is exposed while the insulating area 102 is not exposed. In other words, the pad via is opened so that the opened via does not overlap the dummy oxide films in the pad. In this embodiment, a via diameter is set to 10 μm.

Figure 8E:
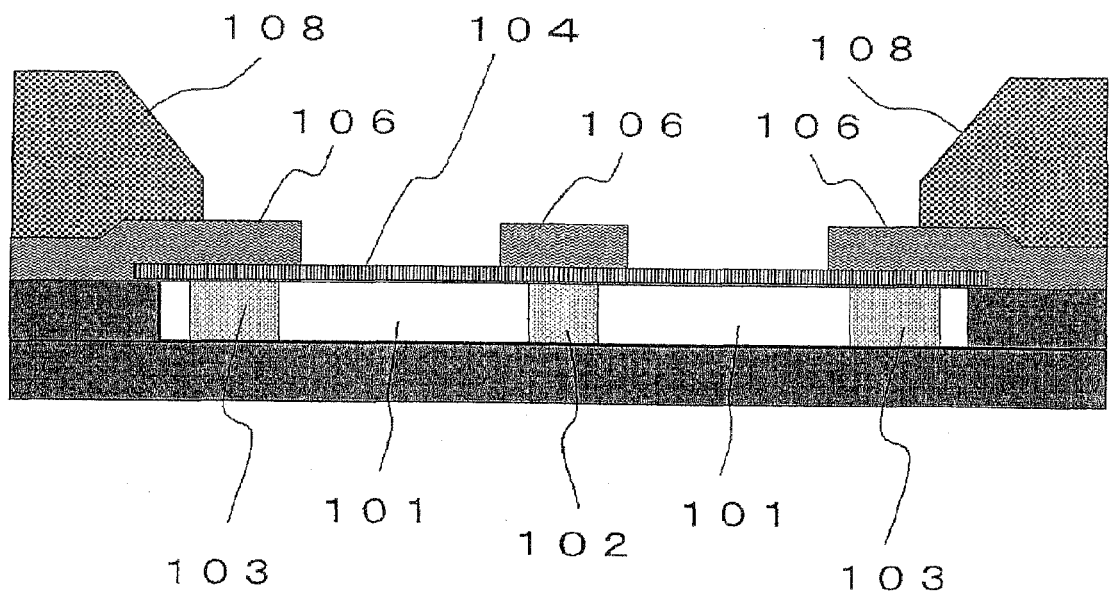
FIGS. 8E and 8F are cross sectional views of the bump structure, illustrating the method for manufacturing the semiconductor device described in the embodiment according to the present invention.
Figure 8F:
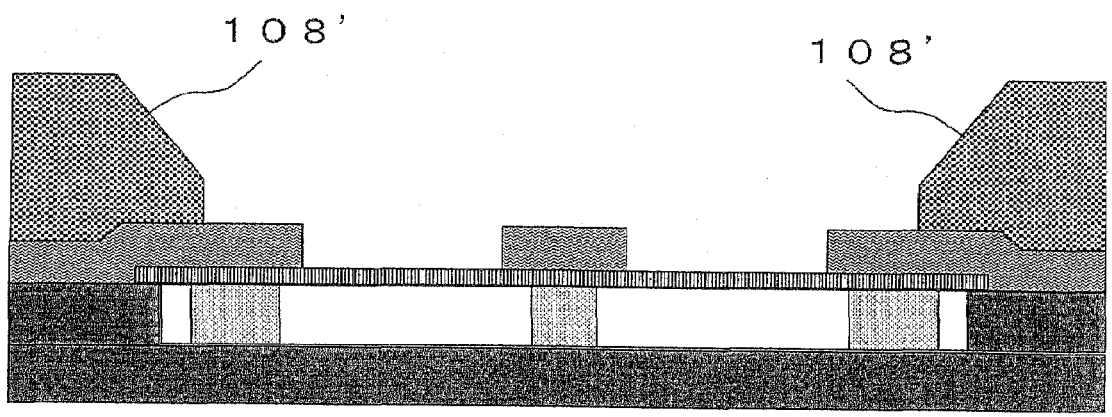
Figure 9G:
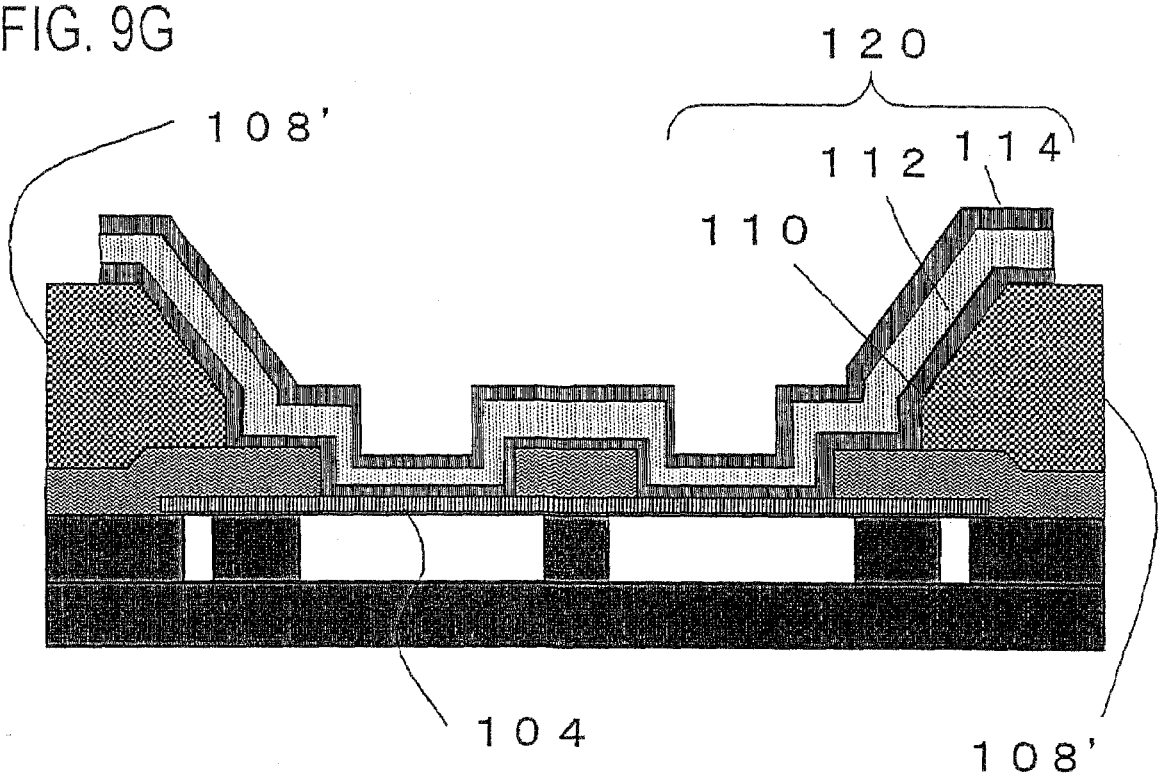
FIG. 9G is a cross sectional view of the bump structure, illustrating the method for manufacturing the semiconductor device described in the embodiment according to the present invention.

Then, a polyimide film 108 is formed over the TiN film 104 and the SiON film 106 via an application method, and after that, exposure thereof is carried out to form an opening on the pad portion 100 (FIG. 8E). Then, as shown in FIG. 8F, a cure process is conducted at 400 degree C. for 10 minutes to form a cured polyimide film 108'. Thereafter, a multi-layered film 110 having TiW and Cu deposited in this sequence is formed in the opening by using a sputter process, and then the unwanted multi-layered film 110 is removed. A Ni film 112 and a Cu film 114 are formed on the multi-layered film 110 via a selective plating (FIG. 9G). As described above, the bump structure comprising the barrier metal film 120 formed on the pad portion 100 via the TiN film 104 therebetween is completed.

The bonding pad according to this embodiment has a configuration, in which, as shown in FIG. 6B, the SiON film 106, which covers the insulating areas 102 and has the opening above the Cu pad areas 101, is formed. A barrier metal film 120 is formed in the opening of the SiON film 106. Such constitution provides the structure, in which the upper portion of the interfaces between the Cu pad areas 101 and the insulating areas 102 are covered with the SiON film 106. Thus, the precipitations of Cu generated from the interfaces can effectively be avoided. The precipitation of Cu from the above-described interface was a particular problem when the polyimide film 108 is formed and the cure at higher temperature is conducted in the conventional process. According to the constitution of this embodiment, such precipitation of Cu can be prevented.

Further, the solder ball is formed on the bonding pad, and the adhesiveness between the solder ball and the barrier metal film 120 can be improved, since the unevenness of the surface is generated in the barrier metal film 120 due to providing the opening in the SiON film 106.

Second Embodiment

Figure 10:
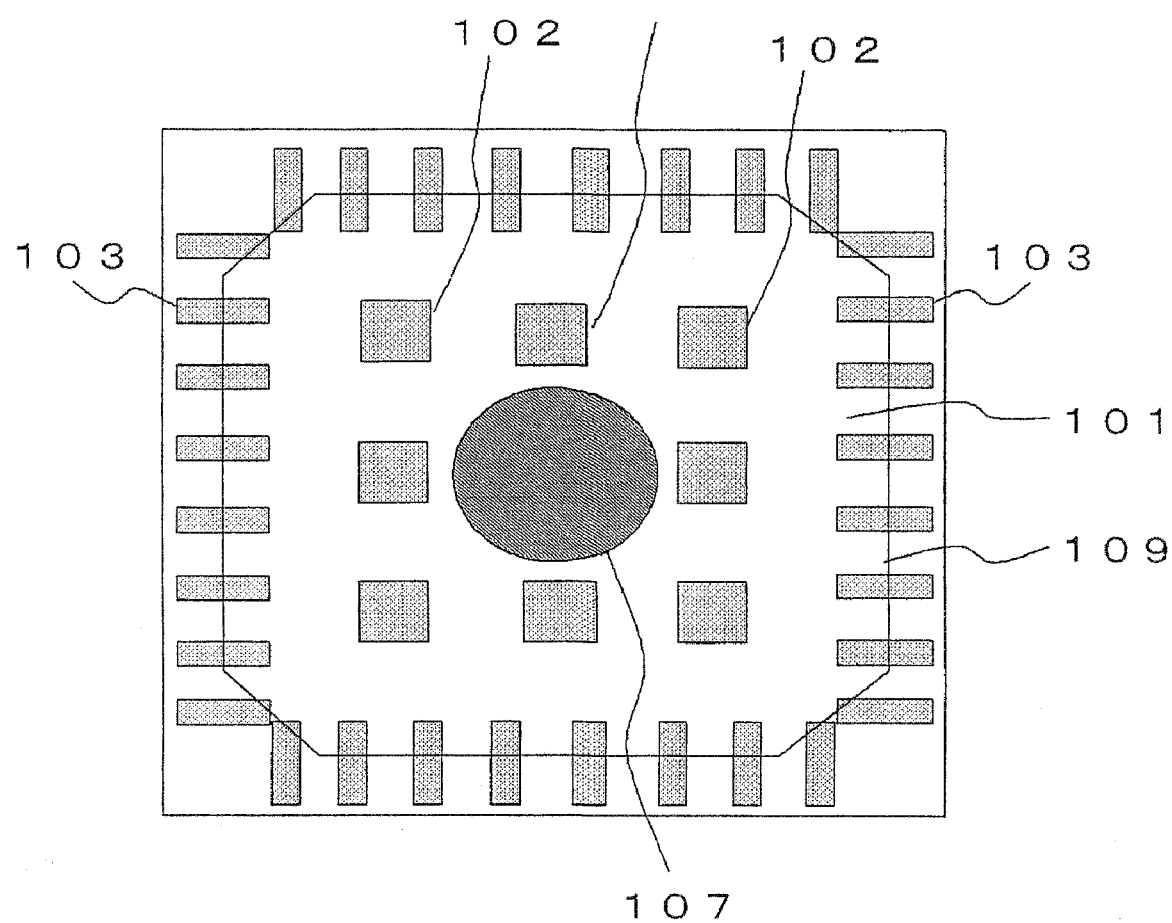
FIG. 10 is a plan view of a pad portion of another embodiment according to the present invention.

Although the configuration of forming a plurality of Cu pad areas 101 in the pad portion is illustrated in the first embodiment, another configuration of forming a single Cu pad area 101 in the pad portion may also be employed. FIG. 10 shows a plan view of a bonding pad having such configuration. As shown in the figure, a plurality of insulating areas 102 are separately provided in the pad portion, and a Cu pad area 101 is formed in an area surrounded by these insulating areas. Insulating areas 103 are formed at the circumferences of the bonding pad. The cross sectional structure thereof is similar to the bonding pad illustrated in the first embodiment.

Since the bonding pad according to this embodiment has a configuration, in which the insulating film covering the insulating areas 102 and having the opening above the Cu pad areas 101 is formed similarly as in the first embodiment, the precipitation of Cu generated from the interface between the Cu pad area 101 and the insulating area 102 can effectively be avoided.

Although the embodiments of the present invention have been described in reference to the annexed figures, it should be understood that these are disclosed for the purpose of illustrating the aspects of the present invention only, and various other configurations than those above-described can also be adopted.

For example, although the flip-chip semiconductor devices are illustrated in the above-described embodiments, the applications of the present invention is not limited thereto, and the present invention may also be applied to a wire-bonding type semiconductor device.

Further, the materials for constituting the elements such as Cu pad area 101, SiON film 106, barrier metal film 120 can be substituted to other suitable materials according to the objectives and the applications thereof.

What is claimed is:

1. A semiconductor device comprising:
   a bonding pad that is an electric coupling for an external circuit, said bonding pad having at least one metal area and a plurality of insulating areas with a plurality of interfaces therebetween;
   an insulating film disposed on said bonding pad, said insulating film having an opening exposing at least part of said metal area, said insulating film covering all of said plurality of interfaces closest to a center of said opening; and
   a diffusion barrier film on said bonding pad beneath said insulating film.

2. The semiconductor device according to claim 1, wherein said plurality of insulating areas are separately provided within said bonding pad.

3. The semiconductor device according to claim 1, further comprising an electrically conductive film on said insulating film and that is electrically connected to said diffusion barrier film.

4. The semiconductor device according to claim 1, wherein said insulating film comprises SiON.

5. The semiconductor device according to claim 1, wherein at least one of said plurality of insulating areas and its associated interface are entirely inside an outer periphery of said opening and covered with a portion of said insulating film.

6. The semiconductor device according to claim 5, wherein more than one of said plurality of insulating areas and its associated interface are entirely inside the outer periphery of said opening and covered with a portion of said insulating film.

* * * * *